(12) United States Patent
Lakrimi et al.

(10) Patent No.: US 9,251,933 B2
(45) Date of Patent: Feb. 2, 2016

(54) SUPERCONDUCTING JOINTS (71) Applicants: M'Hamed Lakrimi, Oxfordshire (GB); Jonathan Noys, Oxfordshire (GB); Michael Simpkins, Buckinghamshire (GB); Adrian Mark Thomas, Oxfordshire (GB)

(72) Inventors: M'Hamed Lakrimi, Oxfordshire (GB); Jonathan Noys, Oxfordshire (GB); Michael Simpkins, Buckinghamshire (GB); Adrian Mark Thomas, Oxfordshire (GB)

(73) Assignee: Siemens PLC, Camberley (GB)

( * ) Notice: Subject to any disclaimer, the term of this patent is extended or adjusted under 35 U.S.C. 154(b) by 0 days.

(21) Appl. No.: 13/945,141

(22) Filed: Jul. 18, 2013

(65) Prior Publication Data
US 2014/0024534 A1    Jan. 23, 2014

(30) Foreign Application Priority Data

Jul. 20, 2012  (GB) .................................. 1212979.7

(51) Int. Cl.
*H01L 39/24* (2006.01)
*H01B 12/16* (2006.01)
*H01L 39/02* (2006.01)
*H02G 15/34* (2006.01)

(52) U.S. Cl.
CPC .............. *H01B 12/16* (2013.01); *H01L 39/02* (2013.01); *H02G 15/34* (2013.01); *Y02E 40/648* (2013.01)

(58) Field of Classification Search
CPC .......... H01B 12/16; H01L 39/02; H02G 15/34
USPC ..................................... 29/599; 505/925, 926
See application file for complete search history.

(56) References Cited

U.S. PATENT DOCUMENTS

| 8,253,024 | B2 | 8/2012 | Belton et al. | |
| 8,315,680 | B2 * | 11/2012 | Le Feuvre et al. | 505/230 |
| 2009/0101325 | A1 | 4/2009 | Belton et al. | |
| 2012/0190553 | A1 * | 7/2012 | Le Feuvre et al. | 505/163 |

FOREIGN PATENT DOCUMENTS

| GB | 2453734 | | 4/2009 | |
| GB | 2481833 | | 1/2012 | |
| GB | 2481833 | A | 1/2012 | |
| GB | 2487538 | | 8/2012 | |
| JP | 2009-99988 | * | 5/2009 | ............ H01L 39/04 |
| JP | 2009099988 | A | 5/2009 | |
| KR | 20030025107 | A | 3/2003 | |
| KR | 20030054150 | A | 7/2003 | |

* cited by examiner

*Primary Examiner* — Paul Wartalowicz
(74) *Attorney, Agent, or Firm* — Schiff Hardin LLP (57) ABSTRACT A superconducting joint and a cooling surface are provided as a combination. The superconducting joint joins superconducting wires each comprising superconducting filaments electrically joined together. The cooling surface comprises a thermally and electrically conductive material. An electrically isolating surface coating is provided on the cooling surface. The superconducting joint, the surface coating and the cooling surface are in thermal contact. The superconducting joint is electrically isolated from the cooling surface by the surface coating. The tails of the superconducting wires are wrapped around the electrically isolating surface coating.

5 Claims, 6 Drawing Sheets

SUPERCONDUCTING JOINTS

BACKGROUND

It is known to produce relatively large electromagnets of superconducting wire for use, for example in magnetic resonance imaging (MRI) systems. Known magnets for MRI systems may be 2 m in diameter, 1.5 m in length and include many tens of kilometers of wire. Commonly, the magnets are composed of several relatively short coils, spaced axially along the axis of a cylindrical magnet, although several other designs are known, and the present exemplary embodiments are not limited to any particular magnet design.

Such superconducting magnets are not normally wound from a single length of superconducting wire. If several separate coils are used, they are usually produced separately and electrically joined together during assembly of the magnet. Even within a single coil, it is often necessary to join several lengths of wire together.

Joints between superconducting wires are difficult to make. Optimally, the joint itself will be superconducting—that is, having a zero resistance when the magnet is in operation. This is often compromised, and "superconducting" joints are often accepted which have a small resistance.

A common known manner of making a superconducting joint is to take the lengths of superconducting wire, and strip any outer cladding, typically copper, from the superconducting filaments from a length at or near their ends.

The superconducting filaments of the two wires may then be twisted together. The resulting twist of filaments is then coiled into a joint cup: a fairly shallow vessel, typically of copper or aluminum.

Alternatively, the filaments may be plaited, rather than twisted, before being coiled into the joint cup.

In other arrangements, the filaments of the wires are simply laid side by side, not necessarily touching one another, and placed within the joint cup.

The superconducting joint is then made as described below.

The present exemplary embodiments accordingly seek improved superconducting joints and methods for cooling superconducting joints to enable the superconducting joints to be sufficiently cooled in magnets which are not cooled by immersion in a liquid cryogen.

In order to manufacture low cryogen inventory superconducting magnets—that is, those which do not rely on cooling by immersion in a bath of cryogen, but are cooled by a reduced volume of cryogen, for example in a thermosiphon or cooling loop—or cooled by solid conduction without the use of cryogens—it is necessary to produce suitably cooled superconducting joints which do not require cooling by immersion in cryogen.

One approach to this problem may be in using flexible thermal conductors such as copper or aluminum braids or laminates thermally linking joints to a refrigerator, or by attaching superconducting joints to a cooled component using an electrically isolating adhesive layer. This latter approach is described, for example, in US 2009/0101325A1.

A difficulty with this latter option arises in achieving sufficient electrical isolation while maintaining adequate thermal conduction for effective cooling of superconducting joints. This generally leads to multiple interfaces between cooled component and superconducting joint, as may be seen in some of the examples described in GB 2453734.

Another approach, in which a superconductor joint is formed in thermal contact with a cooled component, but separated therefrom by an electrically isolating layer, is described in GB 2481833.

That document proposes improved superconducting joints and improved methods for forming superconducting joints in which only a single electrically isolating coating is positioned between the superconducting joint and the cooled component. The electrically isolating coating may be thinner, and is more thermally conductive, than the electrically isolating layers previously employed

SUMMARY

It is an object to improve on these earlier structures by providing superconducting joints, exemplary embodiments of which will be described hereafter.

A superconducting joint and a cooling surface are provided as a combination. The superconducting joint joins superconducting wires each comprising superconducting filaments electrically joined together. The cooling surface comprises a thermally and electrically conductive material. An electrically isolating surface coating is provided on the cooling surface. The superconducting joint, the surface coating and the cooling surface are in thermal contact. The superconducting joint is electrically isolated from the cooling surface by the surface coating. The tails of the superconducting wires are wrapped around the electrically isolating surface coating.

DESCRIPTION OF PREFERRED EXEMPLARY EMBODIMENTS

For the purposes of promoting an understanding of the principles of the invention, reference will now be made to the preferred exemplary embodiments/best mode illustrated in the drawings and specific language will be used to describe the same. It will nevertheless be understood that no limitation of the scope of the invention is thereby intended, and such alterations and further modifications in the illustrated embodiments and such further applications of the principles of the invention as illustrated as would normally occur to one skilled in the art to which the invention relates are included herein.

In one exemplary embodiment, a superconducting joint is provided in combination with a cooling surface, the superconducting joint joining superconducting wires each comprising superconducting filaments electrically joined together and tails of the superconducting wires, being those parts of the wires leading to the joint; the cooling surface comprising a thermally and electrically conductive material, wherein an electrically isolating surface coating is provided on the cooling surface, the superconducting joint, the surface coating and the cooling surface being in thermal contact, while the superconducting joint is electrically isolated from the cooling surface by the surface coating, wherein the cooling surface is a cryogen pipe, the electrically isolating surface coating is provided on the surface of the cryogen pipe, and the tails are wrapped around the electrically isolating surface coating.

In another exemplary embodiment, a superconducting joint is provided in combination with a cooling surface, the superconducting joint joining superconducting wires each comprising superconducting filaments electrically joined together and tails of the superconducting wires, being those parts of the wires leading to the joint; the cooling surface comprising a thermally and electrically conductive material, wherein an electrically isolating surface coating is provided on the cooling surface, the superconducting joint, the surface coating and the cooling surface being in thermal contact, while the superconducting joint is electrically isolated from the cooling surface by the surface coating, wherein the cooling surface is a thermal bus bar, the electrically isolating surface coating is provided on the surface of the thermal bus bar, and the tails are wrapped around the electrically isolating surface coating.

In another exemplary embodiment, a superconducting joint is provided in combination with a cooling surface, the superconducting joint joining superconducting wires each comprising superconducting filaments electrically joined together and tails of the superconducting wires, being those parts of the wires leading to the joint; the cooling surface comprising a thermally and electrically conductive material, wherein an electrically isolating surface coating is provided between the cooling surface and the joint, the superconducting joint, the surface coating and the cooling surface being in mechanical and thermal contact, while the superconducting joint is electrically isolated from the cooling surface by the surface coating, wherein the cooling surface is provided with a thermally conductive tag in thermal contact with the cooling surface and the superconducting joint is mechanically restrained in thermal and mechanical contact with the tag.

The electrically isolating surface coating may be applied to the thermally conductive tag. Alternatively, the electrically isolating surface may be applied to the superconducting joint.

The above, and further, objects, characteristics and advantages of the exemplary embodiments will become more apparent from the following description of certain exemplary embodiments, in conjunction with the accompanying drawings.

In one exemplary embodiment superconducting joints are provided which are effectively cooled and occupy less space than those of the conventional arrangements mentioned above. The one exemplary embodiment allows a large number of joints to be fitted to a low cryogen inventory superconducting magnet system, and to be effectively cooled.

As discussed above, low cryogen inventory superconducting magnets are typically cooled by a thermosiphon, being a thermally conductive pipe in thermal contact with the magnet and carrying a cryogen around a closed loop in which it is re-cooled and re-circulated. Alternatively, solid conduction cooling may be used, where joints are cooled by thermal conduction through a thermal bus, which is itself in thermal contact with a cryogenic refrigerator.

In particular, the one exemplary provides superconducting joints which are in direct thermal contact with the conductive pipe of the thermosiphon, or the thermal bus bar, as appropriate, through a single electrically isolating surface coating. In alternative embodiments, the thermosiphon pipe or thermal bus bar, or at least the appropriate portion of it, is of electrically non-conductive material, in which case the provision of an electrically insulating coating on the surface is not necessary.

Figure 1:
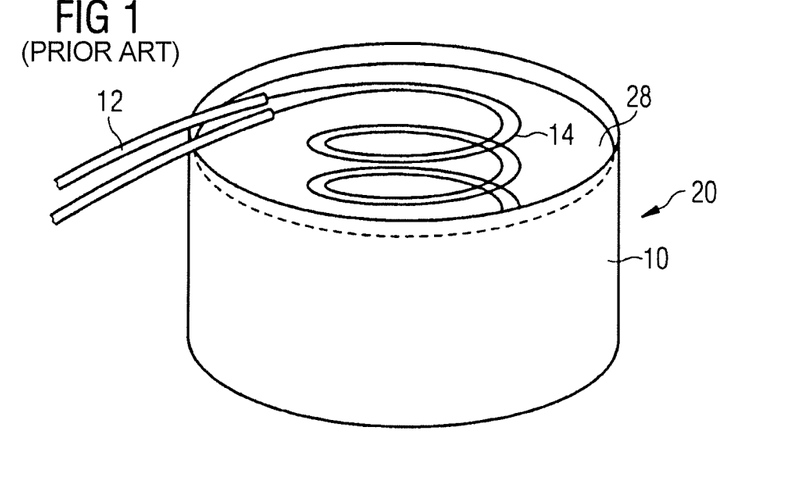
FIG. 1 shows a conventional superconducting joint using a joint cup for filling with Wood's metal.
Figure 2:
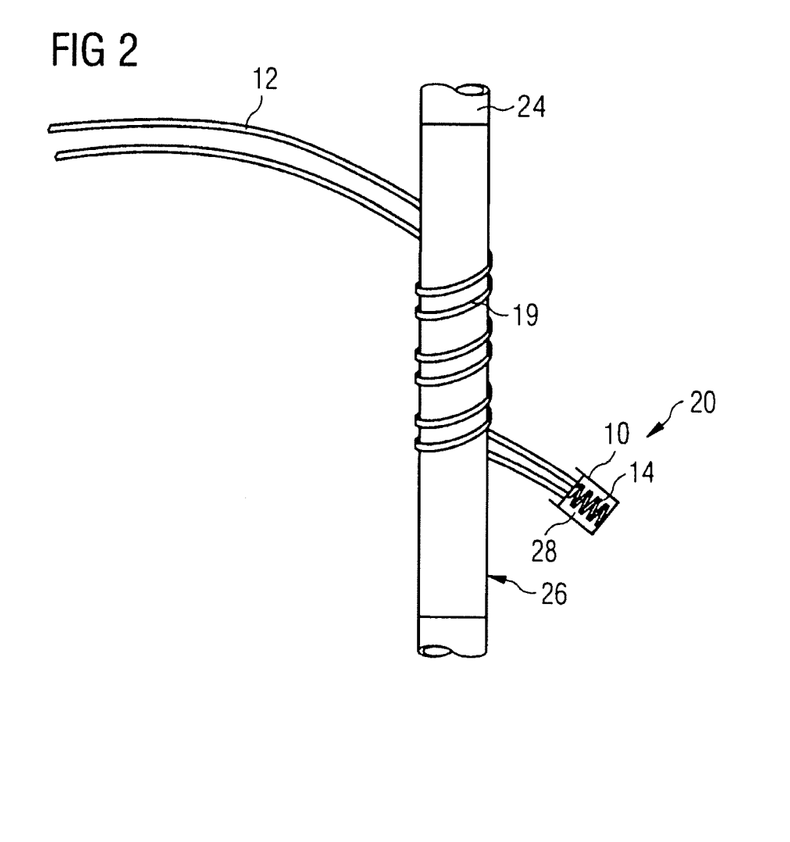
FIGS. 2-10 schematically represent respective exemplary embodiments of the present invention.

FIG. 2 schematically illustrates one embodiment of the present invention. According to this embodiment of the invention, a superconducting joint 20 comprises a joint cup 10 containing a conventional joint, composed of superconducting filaments 14 embedded in superconducting joint material 28. The joint cup 10 may be rather smaller than those used for conventional joints. Filaments 14 of superconducting wires 12 are placed in the joint cup 10, as described in itself with reference to the prior art and FIG. 1. The filaments may be twisted or plaited together, or may not be. The joint cup 10 is filled with a molten superconducting material 28, such as Wood's metal, which is then allowed to cool and harden. This step is conventional in itself.

The cryogen pipe 24, at least in the vicinity of the joint cup 10, is provided with an electrically isolating coating layer 26. This may be a sprayed deposition of aluminum oxide or ceramic on a copper pipe, a chemically produced layer of copper oxide on a copper pipe, or a layer of aluminum oxide sprayed or formed on an aluminum pipe, for example by anodizing. Alternatively, a layer of epoxy resin or similar may be formed on the relevant surface of the pipe, for example by spraying.

Joint "tails" 19—the ends of superconducting wires leading to the joint itself—are wound around thermosiphon pipe 24, over the coating 26. The tails 19 are fixed in place by an appropriate mechanical means, such as tape, solder, straps, and clamps (not illustrated).

In use, the structure of FIG. 2 is cooled to cryogenic temperatures by a cryogen flowing though pipe 24. In cooling, provided that materials with appropriate relative thermal expansion coefficients have been chosen, tails 19 will contract onto the pipe 24, ensuring a tight mechanical interface between the superconducting material 28 and the pipe 24, with the electrically insulating layer 26 between them. In other embodiments, the tails 19 do not thermally contract onto the pipe, but rely on the mechanical means retaining them in position.

Either arrangement provides good thermal connection between the cryogen and the tails 19, the tails 19 of the joint being separated from the cryogen only by the material of the pipe 24 and the electrically insulating coating 26.

The tails 19 are cooled by contact with the cryogen-cooled pipe 24 through electrically insulating coating 26. The joint 20 itself, in joint cup 10, may not be in direct contact with the pipe 24 or its electrically insulating coating 26, but may be cooled by thermal conduction along the tails 19. In other exemplary embodiments, the joint cup 10 may be held in contact with the pipe 24 through its coating 26, for example by one of the mechanical means discussed above.

While the electrically insulating coating 26 must be able to withstand large voltages, for example up to 5 kV which may occur during a quench, it may be relatively thin. Such coating may be a ceramic or epoxy layer which may be sprayed on to the pipe 24. Some epoxy resins, such as some of those sold under the STYCAST® brand by Emerson & Cuming, have a greater than normal thermal conductivity, and may be found useful in this application.

Figure 3:
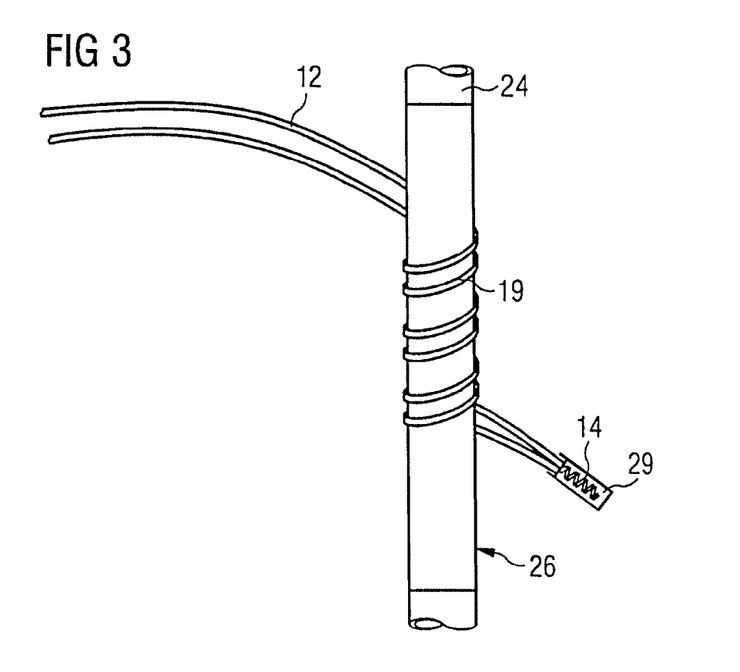

FIG. 3 shows another exemplary embodiment of the embodiment of FIG. 2, in which the superconducting joint 29 is not formed using a joint cup, but is formed by an alternative method, conventional in itself, such as by using a clamp; electromechanical pulse technology or ultrasonic welding. In other respects, this embodiment corresponds to the embodiment of FIG. 2. The joint 29 may be cooled by thermal conduction along the material of the tails, as illustrated, or may be in contact with the pipe 24 through its coating 26, for example by one of the mechanical means discussed above.

Figure 4:
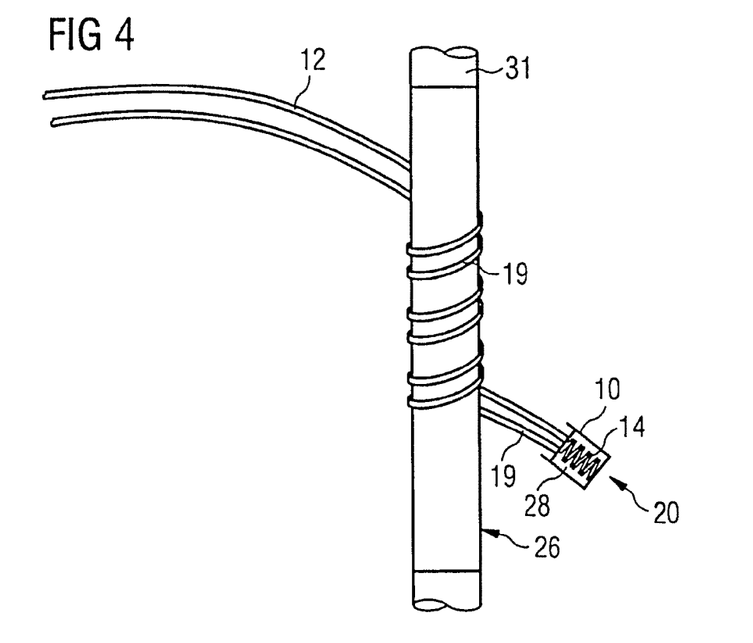

FIG. 4 shows another exemplary of the embodiment of FIG. 2, in which the cryogen-carrying pipe is replaced with a solid thermal bus bar 31. In other respects, this embodiment corresponds to the embodiment of FIG. 2. The joint 20 may be cooled by thermal conduction along the material of the tails, as illustrated, or may be in contact with the pipe 24 through its coating 26, for example by one of the mechanical means discussed above.

Figure 5:
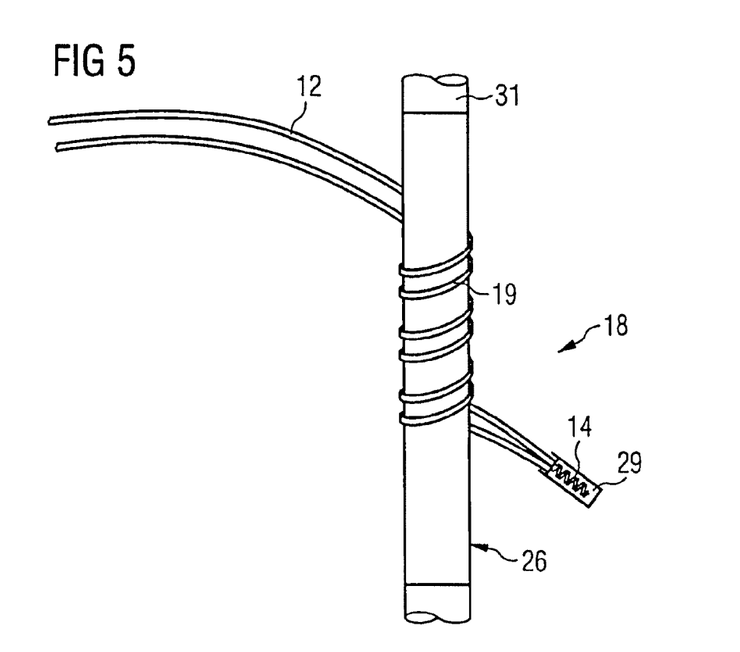

FIG. 5 shows a further exemplary embodiment of the embodiment of FIG. 2. Like in the embodiment of FIG. 3, the superconducting joint 29 is not formed using a joint cup, but is formed by an alternative method, conventional in itself, such as by using a clamp, electromechanical pulse technology or ultrasonic welding. Like in the embodiment of FIG. 4, the cryogen-carrying pipe is replaced with a solid thermal bus bar 31. In other respects, this embodiment corresponds to the embodiment of FIG. 2. The joint 29 may be cooled by thermal conduction along the material of the tails 19, as illustrated, or may be in contact with the pipe 24 through its coating 26, for example by one of the mechanical means discussed above.

Figure 6:
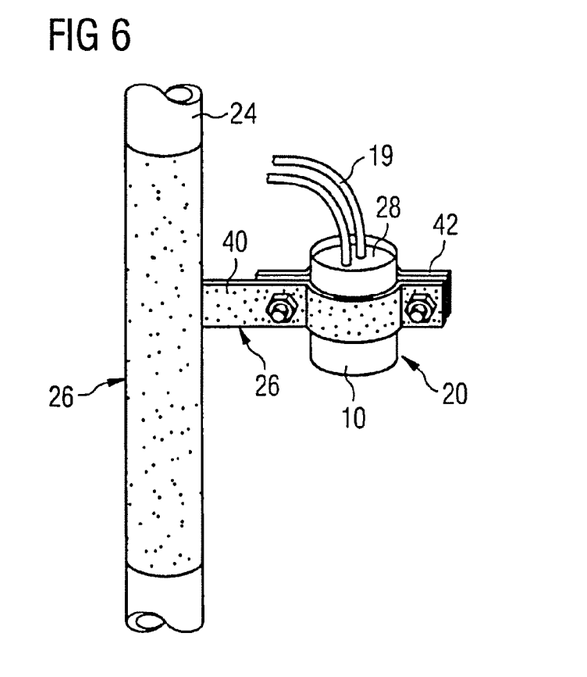

FIG. 6 illustrates another exemplary embodiment of the present invention. In this embodiment, a thermally conductive tag 40 is provided, mechanically and thermally joined to the material of cryogen pipe 24. In preferred embodiments, tag 40 and pipe 24 are of metal, and they are joined by welding, soldering or brazing to provide a thermally conductive joint. Alternatively, tag 40 may be clamped on to the pipe. In such cases, the tag 40 should be provided with electrically isolating surface coating 26 on all surfaces which may come into contact with the superconducting joint, but should have no such coating on surfaces which contact the pipe 24, to ensure and effective thermal joint between pipe 24 and tag 40.

The tag 40 is provided with an electrically isolating surface coating 26, as discussed above with reference to FIG. 2. The coating 26 may extend along an adjacent part of pipe 24. A superconducting joint 20, of conventional construction in itself, is mechanically attached to the tag 40 by any suitable method such as soldering, clamping, use of straps or tape. In the illustrated embodiment, the superconducting joint is provided by a joint cup 10 filled with superconducting material 28, in which superconducting filaments are embedded. Joint tails 19 are shown. In the illustrated embodiment, tag 40 is shaped to accommodate the joint cup, and a retaining piece 42 is provided to hold the joint cup 10 in place. The retaining piece 42 and the tag 40 are joined by any suitable method, to retain the joint cup 10 between them. In the illustrated embodiment, the tag 40 and retaining piece 42 are bolted together, but alternative retaining means such as sprung clamps, zip ties, binding wire, and tape may be used. The retaining piece 42 may be of a metal, coated with an electrically isolating surface coating such as that applied to the tag 40. Alternatively, the retaining piece may be of an electrically non conductive material, such as a fiber-reinforced plastic. Alternatively, tag 40 may be shaped to include an integral clip formation to retain joint cup 10 without further pieces.

In variants of this embodiment, the joint cup may be bonded to the tag, with no retaining piece then being required.

In other variants of this embodiment, the tag may be hollow, with an interior cavity exposed to the interior of pipe 24 such that the tag contains cryogen. This may improve thermal transfer between the superconducting joint and the cryogen.

The superconducting joint 20 is cooled by solid conduction through the coating 26 to the tag 40, thence to the pipe 24 and to the cryogen flowing within the pipe.

In another embodiment, the cryogen-carrying pipe 24 of FIG. 6 is replaced by a solid thermal bus bar, such as that illustrated in FIG. 4.

In further embodiments, the tails 19 may be wrapped around the coating 26 on the pipe 24 or thermal bus bar, to assist cooling of the superconducting joint in a manner similar to the cooling employed in the embodiments of FIGS. 2-5.

Figure 7:
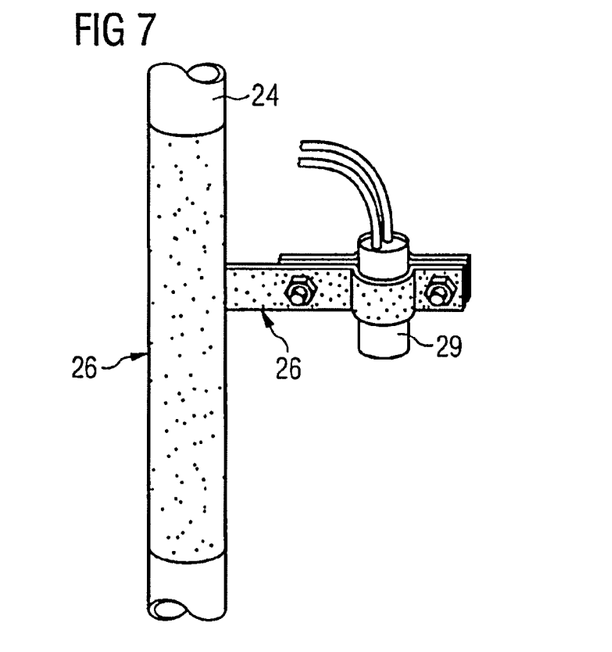

FIG. 7 illustrates another exemplary embodiment, similar to that of FIG. 6, in which the superconducting joint 29 does not comprise a joint cup 10 and superconducting material in which filaments are embedded, but instead is formed according to an alternative conventional structure such as by using a clamp; electromechanical pulse technology or ultrasonic welding. In all other respects, this embodiment corresponds to the embodiment of FIG. 6, and all of the variants discussed with reference to FIG. 6 may be applied to this embodiment.

Figure 8:
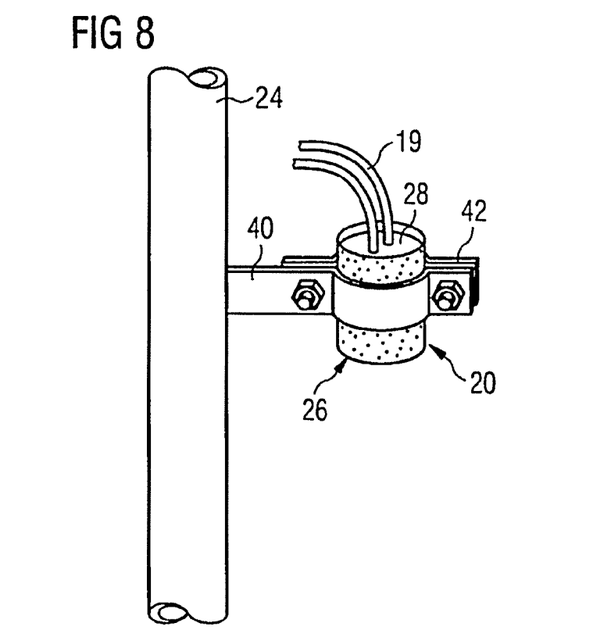
Figure 9:
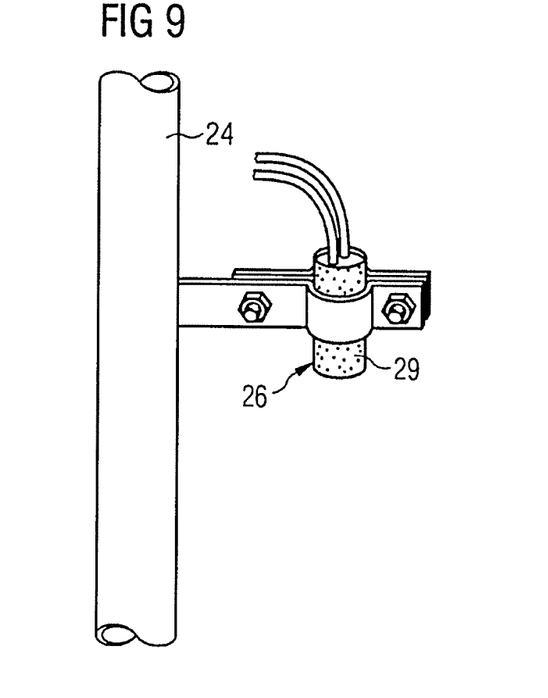

FIG. 8-9 show further exemplary embodiments, similar to those discussed with reference to FIGS. 6-7 respectively. In these embodiments, the electrically isolating surface coating 26 is applied to the joint cup 10 or the joint 29, respectively, rather than to the tag 40 or the pipe 24 or bus bar 31. In these embodiments, there is no need to apply a surface coating to the tag 40 or the tube 24 or bus bar 31. Such embodiments may be found simpler to manufacture, as batches of coated joint cups 10 or similar may be prepared in advance, and this may be found simpler than coating part of a thermal bus bar of cryogen tube 24.

Figure 10:
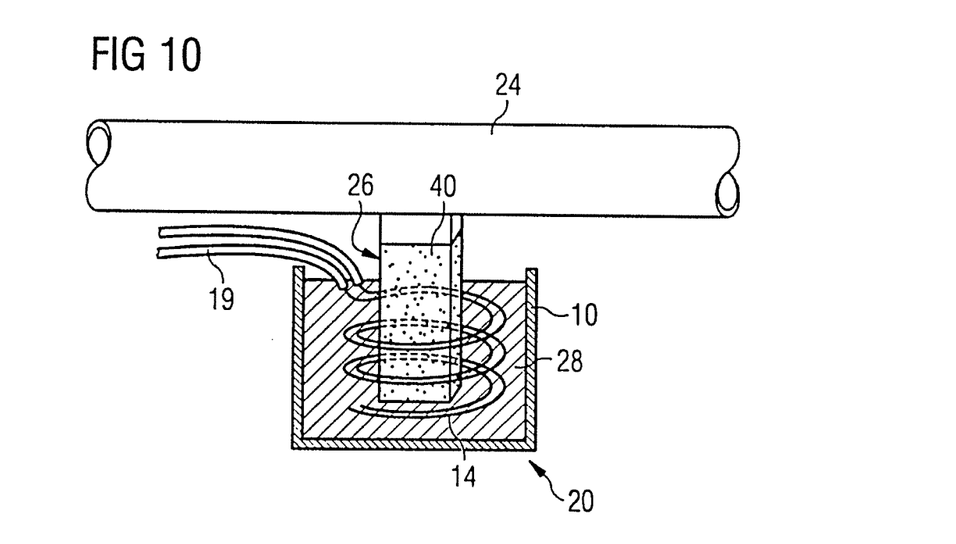

FIG. 10 illustrates another exemplary embodiment of the present invention, which has certain features in common with the embodiments of FIGS. 5-9. Cryogen pipe 24 is provided with a tag 40 by any of the means discussed with reference to FIGS. 5-9. The tag 40 is coated with an electrically isolating surface coating 26. Tag 40 is a solid tag, and does not contain a cavity exposed to the interior or pipe 24 such that the tag contains cryogen.

A superconducting joint 20 of the type illustrated in FIG. 1 is formed, with a joint cup 10 containing superconducting material 28 wherein superconducting filaments 14 are embedded. Joint tails 19 are shown. During formation of the joint, while the superconducting material 28 is molten, a part of the tag 40 is embedded in the superconducting material 28. At least that part of the tag 40 is covered with an electrically isolating surface coating 26. It may well be found simpler to coat a larger portion of the tag.

In use, pipe 24 is cooled by the passage of cryogen through it. The tag 40 is joined to pipe 24 in a thermally conducting manner, and so is cooled by solid thermal conduction to the pipe, which is itself cooled by the passage of cryogen. The tag 40 is in thermal contact with the superconducting material 28 of the joint, through the surface coating 26. The cooled tag acts to cool the superconducting joint by solid thermal conduction. The electrically isolating surface coating 26 ensures that the superconducting joint is electrically isolated from the tag 40 and the pipe 24.

The joints are effectively cooled in this manner. Depending on the relative thermal properties of the superconducting material 28 and the material of tag 40, the superconducting material 28 may contract onto the tag 40, ensuring a good thermal contact.

In similar embodiments, the cryogen tube 24 may be replaced by a thermal bus bar 31 such as discussed in relation to FIG. 4. The tag 40 may be joined to the thermal bus bar, or may form an integral part of the bus bar.

In any of the relevant embodiments, the thermal bus bar may be of round cross-section as illustrated, or of square or rectangular cross-section: indeed, any cross-section may be used as deemed appropriate. The thermal bus bar may be of irregular shape. It must be composed of a material of sufficient cross-sectional area and thermal conductivity to achieve the desired cooling effect. Example materials which may be found appropriate include copper, aluminum and composite materials containing fibers or mesh of copper or aluminum.

Figure 11:
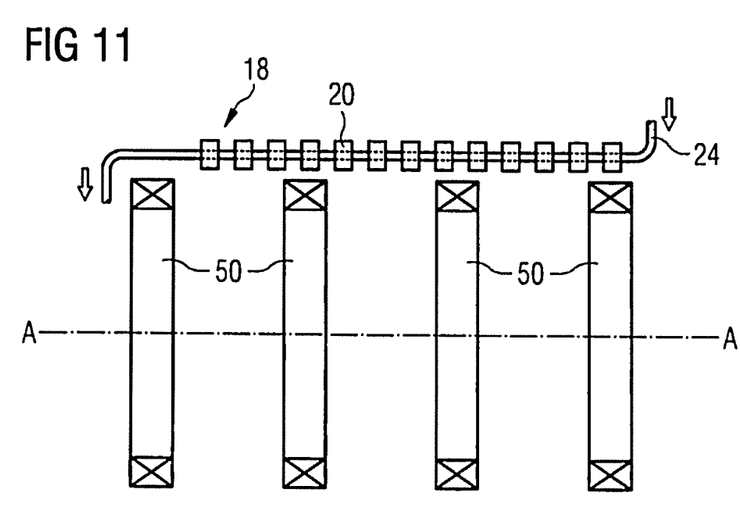
FIG. 11 schematically illustrates a partial axial cross-section example of a superconducting magnet structure cooled by a thermosiphon loop and provided with a number of superconducting joints according to an exemplary embodiment of the present invention.

FIG. 11 schematically illustrates a partial axial cross-section of an example superconducting magnet structure cooled by a thermosiphon loop and provided with a number of superconducting joints 20, each represented only schematically, and each according to an embodiment of the present invention.

As shown, a number of coils 50 of superconducting wire are provided, in this case axially aligned along axis A-A. Part of a cryogen pipe 24, itself being part of a cooling loop arrangement, is shown. While the axis A-A is intended to be horizontal in this example, the pipe 24 is provided with a slight gradient to assist with gravity-fed circulation of cryogen around the cooling loop. A number of superconducting joints, labeled 18 jointly and 20 individually, are formed along the pipe. As discussed above, it is common to require joints between several pieces of superconducting wire making up each coil, as well as joints between the coils, so it is common for the number of superconducting joints required to significantly exceed the number of coils provided. The superconducting wires extending from the coils 50 to each joint 20 are not shown in the drawings.

In use, the superconducting joints 18 will be cooled to below their superconducting transition temperature before any electric current is applied to the magnet. There should therefore be a negligible amount of power dissipated in each joint 20, meaning that the steady-state thermal load on the cooling loop from the superconducting joints should be relatively small. This situation does not apply in the case of a quench, as is well known in the art, but is not directly relevant to the present invention.

The tags 40 referred to above in relation to various embodiments may be composed of a braid or laminate of thermally conductive material such as aluminum or copper, or solid pieces of such material. Alternatively, the tags may be composed of a thermally and electrically conductive composite material such as a resin or other plastic material reinforced by fibers or mesh of copper or aluminum, for example. As an alternative to the electrically isolating surface coating described above, the cryogen pipe or thermal bus bar, as appropriate, may be constructed of a thermally conductive, electrically isolating material.

While the invention has been described with reference to a limited number of specific examples, various modifications and variants will be apparent to those skilled in the art. For example, superconducting materials other than Wood's metal may be used for forming the superconducting joints, and the present invention may be applied regardless of the cryogen used, or the application to which the joined superconducting wires are put. While the superconducting magnets described above are common applications for superconducting joints, the present invention may find application in any superconducting system, such as motors, generators or energy storage systems.

The present invention has been described with reference to certain embodiments which use joint cups which are circular cylindrical in shape. However, the shape of the joint cup itself is not a limitation of the invention, and the invention may be applied to joint cups which are, for example, circular, rectangular, triangular, oval and so on in cross-section. In fact, the joint cups may be of any shape, and any appropriate size, to function as a container for the superconducting joint and to hold an appropriate volume of molten superconducting material such as Wood's metal.

As discussed above, the superconducting filaments 14 of the wires 12 may be twisted together; or may be plaited together; or may simply be placed side by side, before formation of the superconducting joint. Depending on the shape of the joint cup, the filaments may need to be coiled to allow them to be placed in the joint cup Although preferred exemplary embodiments are shown and described in detail in the drawings and in the preceding specification, they should be viewed as purely exemplary and not as limiting the invention. It is noted that only preferred exemplary embodiments are shown and described, and all variations and modifications that presently or in the future lie within the protective scope of the invention should be protected.

We claim as our invention:

1. A combination, comprising:
    a superconducting joint comprising a cup or clamp joining superconducting wires in the cup or clamp, the wires each comprising superconducting filaments electrically joined together and tails of the superconducting wires being parts of the wires leading to the joint;
    a cooling surface comprising a thermally and electrically conductive material external to and spaced from the superconducting joint cup or clamp;
    an electrically isolating surface coating provided on the cooling surface;
    the superconducting joint, the surface coating and the cooling surface being in thermal contact;
    the superconducting joint being electrically isolated from the cooling surface by the surface coating;
    the cooling surface being a cryogen pipe;
    the electrically isolating surface coating being provided on a surface of the cryogen pipe serving as the cooling surface; and
    the tails being wrapped around the electrically isolating surface coating and thermally cooling the joint by providing a thermal conductive path between the cooling surface and the joint.

2. The combination according to claim 1 wherein the joint comprises a joint cup containing a superconducting material in which exposed filaments of the superconducting wires are embedded.

3. The combination according to claim 1 wherein the electrically isolating surface coating comprises one of:
    a sprayed deposition of aluminum oxide or ceramic,
    a layer of copper oxide on a copper cooling surface,
    a layer of aluminum oxide on an aluminum cooling surface, and
    a layer of epoxy resin.

4. The combination according to claim 1 wherein the tails are fixed in place by a mechanical means.

5. A combination, comprising:
    a superconducting joint comprising a cup or clamp joining superconducting wires each comprising superconducting filaments electrically joined together and tails of the superconducting wires external to the cup or clamp being parts of wires leading to the joint;
    a cooling surface comprising a thermally and electrically conductive material;
    an electrically isolating surface coating provided on the cooling surface;
    the superconducting joint, the surface coating and the cooling surface being in thermal contact;
    the superconducting joint being electrically isolated from the cooling surface by the surface coating;
    the cooling surface being a cryogen pipe;
    the electrically isolating surface coating being provided on a surface of the cryogen pipe serving as the cooling surface; and the tails external to the cup or clamp being wrapped around the electrically isolating surface coating and thermally cooling the joint by providing a thermal conductive path between the cooling surface and the joint.

* * * * *